(12) United States Patent
Kawawa et al.

(10) Patent No.: US 11,862,439 B2
(45) Date of Patent: Jan. 2, 2024

(54) SUBSTRATE PROCESSING APPARATUS AND CHARGE NEUTRALIZATION METHOD FOR MOUNTING TABLE

(71) Applicant: TOKYO ELECTRON LIMITED, Tokyo (JP)

(72) Inventors: Takahiro Kawawa, Yamanashi (JP); Hideomi Hosaka, Yamanashi (JP); Kouichi Nakajima, Yamanashi (JP); Masamichi Hara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 520 days.

(21) Appl. No.: 16/821,708

(22) Filed: Mar. 17, 2020

(65) Prior Publication Data

US 2020/0312636 A1 Oct. 1, 2020

(30) Foreign Application Priority Data

Mar. 26, 2019 (JP) ................................. 2019-058146

(51) Int. Cl.
*H01J 37/32* (2006.01)
*H01L 21/683* (2006.01)
*C23C 16/458* (2006.01)
*G01R 29/24* (2006.01)

(52) U.S. Cl.
CPC .... *H01J 37/32697* (2013.01); *C23C 16/4583* (2013.01); *G01R 29/24* (2013.01); *H01J 37/32715* (2013.01); *H01L 21/6831* (2013.01); *H01J 2237/0206* (2013.01); *H01J 2237/2007* (2013.01); *H01J 2237/20214* (2013.01)

(58) Field of Classification Search
None
See application file for complete search history.

(56) References Cited

U.S. PATENT DOCUMENTS

| 4,793,908 A * | 12/1988 | Scott | C23C 14/221 204/192.15 |
| 6,431,769 B1 * | 8/2002 | Fukuda | G03F 7/162 438/758 |
| 2002/0139666 A1 * | 10/2002 | Hsueh | C23C 14/547 204/298.03 |

(Continued)

FOREIGN PATENT DOCUMENTS

| JP | 2000-332088 A | 11/2000 |
| JP | 2014-137905 A | 7/2014 |

(Continued)

*Primary Examiner* — Jeffrie R Lund
*Assistant Examiner* — Tiffany Z Nuckols
(74) *Attorney, Agent, or Firm* — Fenwick & West LLP

(57) ABSTRACT

In a substrate processing apparatus for processing a substrate, a processing chamber accommodating the substrate is provided. A mounting table is disposed in the processing chamber and configured to attract and hold the substrate using an electrostatic attractive force. A charge amount measurement unit is disposed in the processing chamber and configured to measure charge amount of a substrate attraction surface of the mounting table. A charge neutralization mechanism is configured to neutralize the substrate attraction surface of the mounting table. A retreating mechanism is configured to make the charge amount measurement unit retreat from a measurement position facing the substrate attraction surface of the mounting table.

7 Claims, 9 Drawing Sheets

(56) References Cited

U.S. PATENT DOCUMENTS

| | | | | |
|---|---|---|---|---|
| 2004/0019442 A1* | 1/2004 | Kitajima | ............... | G01N 27/221 |
| | | | | 702/64 |
| 2005/0233590 A1* | 10/2005 | Yao | ................... | H01L 21/31116 |
| | | | | 257/E21.252 |
| 2010/0089315 A1* | 4/2010 | Brown | ................ | H01L 21/6719 |
| | | | | 118/504 |
| 2012/0006675 A1* | 1/2012 | Yamamoto | .......... | C23C 14/3492 |
| | | | | 204/192.1 |

FOREIGN PATENT DOCUMENTS

| | | |
|---|---|---|
| KR | 10-2001-0051210 A | 6/2001 |
| WO | WO 2016/120971 A1 | 8/2016 |

* cited by examiner

SUBSTRATE PROCESSING APPARATUS AND CHARGE NEUTRALIZATION METHOD FOR MOUNTING TABLE

CROSS-REFERENCE TO RELATED APPLICATION

This application claims priority to Japanese Patent Application No. 2019-058146, filed on Mar. 26, 2019, the entire contents of which are incorporated herein by reference.

TECHNICAL FIELD

The present disclosure relates to a substrate processing apparatus and a charge neutralization method for a mounting table.

BACKGROUND

Japanese Patent Application Publication No. 2014-137905 discloses a charged particle beam device including an electrostatic chuck for holding a sample to which a charged particle beam is irradiated and a sample chamber where the electrostatic chuck is disposed. This charged particle beam device includes a potential measuring device for measuring the potential of the electrostatic chuck on the attraction surface side of the sample, and a controller for measuring the potential using the potential measuring device in a state where the sample is attracted by the electrostatic chuck. Further, in this charged particle beam device, charge neutralization is performed when the charge amount of the electrostatic chuck is greater than a certain value.

The present disclosure prevents a problem that occurs when a substrate is attracted and held on a mounting table of a substrate processing apparatus or when a substrate is removed from the mounting table without deteriorating a throughput.

SUMMARY

In accordance with an aspect of the present disclosure, there is provided a substrate processing apparatus for processing a substrate, comprising: a processing chamber accommodating the substrate, a mounting table disposed in the processing chamber and configured to attract and hold the substrate using an electrostatic attractive force; a charge amount measurement unit disposed in the processing chamber and configured to measure charge amount of a substrate attraction surface of the mounting table; a charge neutralization mechanism configured to neutralize the substrate attraction surface of the mounting table; and a retreating mechanism configured to make the charge amount measurement unit retreat from a measurement position facing the substrate attraction surface of the mounting table.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
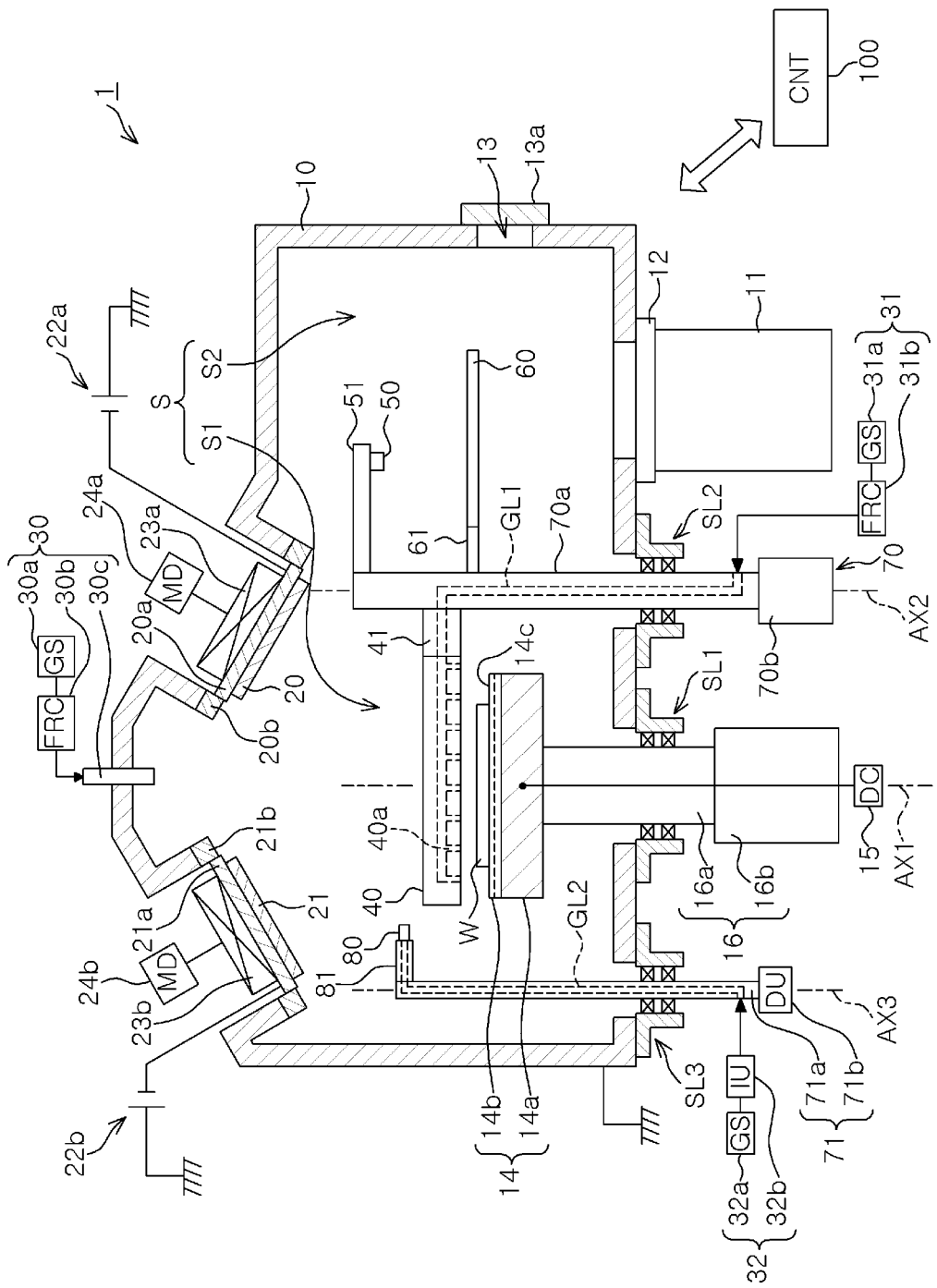
FIG. 1 is a vertical cross-sectional view schematically showing a configuration of a film forming apparatus as a substrate processing apparatus according to an embodiment.

In a semiconductor device manufacturing process, substrate treatment such as film formation, etching, or the like is performed on a substrate such as a semiconductor wafer (hereinafter, referred to as "wafer") or the like. In this substrate treatment, an electrostatic chuck may be used to fix the substrate on a mounting table. The electrostatic chuck attracts and holds a target object using an electrostatic attractive force such as Coulomb force, Johnson-Rahbek force, or the like.

The substrate fixed on the electrostatic chuck is removed from the electrostatic chuck after the substrate treatment. The removal (dechucking) is performed by raising support pins that are movable to penetrate through the electrostatic chuck and lifting the substrate therefrom.

The electrostatic chuck is an insulating member having therein an electrode plate, and an attraction holding surface thereof is made of a dielectric material. Therefore, residual charges are generated on the attraction holding surface of the electrostatic chuck due to charging caused by friction with the substrate or the like. The residual charges thus generated may cause a problem. For example, if a large amount of residual charges is accumulated, the substrate may be damaged during the above-described dechucking of the substrate. In addition, for example, if a large amount of residual charges is accumulated, the position of the substrate with respect to the support pins is shifted during the dechucking. Accordingly, the substrate may be transferred from the support pins to an undesirable position in a transfer unit.

The above-described problem can be solved by performing charge neutralization on the electrostatic chuck for each substrate, for example. However, if the charge neutralization is performed for each substrate, the throughput deteriorates.

In addition, as in the case described in Japanese Patent Application Publication No. 2014-137905, it is considered to provide a surface potential sensor for measuring the potential of the attraction surface of the electrostatic chuck and to perform charge neutralization when the charge amount of the electrostatic chuck is greater than a certain value.

However, the charged particle beam device disclosed in Japanese Patent Application Publication No. 2014-137905 is not a substrate processing apparatus for performing substrate treatment such as film formation or the like. In the substrate processing apparatus, in the case of measuring the potential of the attraction surface of the electrostatic chuck using the surface potential sensor, it is necessary to provide the surface potential sensor at a position facing the electrostatic chuck. When the surface potential sensor is disposed at the position facing the electrostatic chuck, the substrate treatment is hindered.

Therefore, the present disclosure prevents a problem that occurs when the substrate is attracted and held on the mounting table of the substrate processing apparatus by an electrostatic force or when the substrate is removed from the mounting table without hindering the substrate treatment and deteriorating the throughput.

Hereinafter, a substrate processing apparatus and a charge neutralization method for a mounting table of the present embodiment will be described with reference to the drawings. Like reference numerals will be given to like parts having substantially the same function and structure throughout the specification and the drawings, and redundant description thereof will be omitted.

Figure 2:
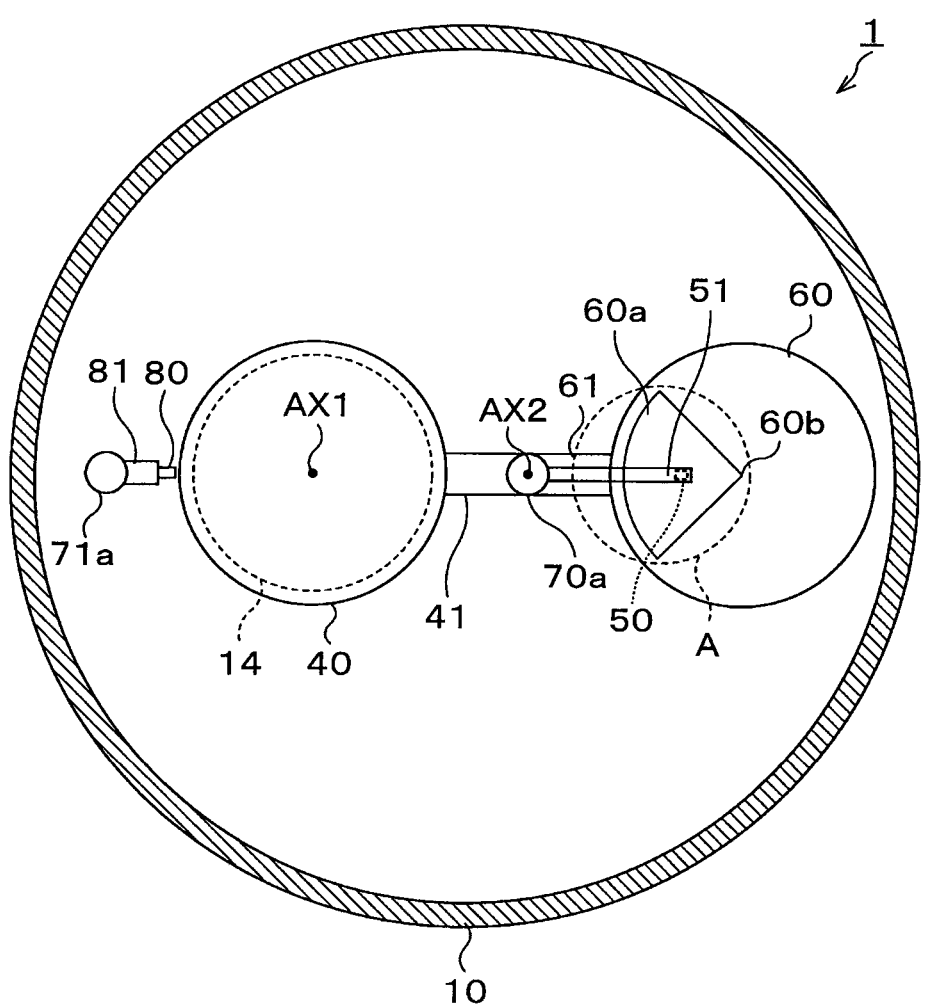
FIG. 2 is a horizontal cross-sectional view schematically showing the configuration of the film forming apparatus as the substrate processing apparatus according to the embodiment.

FIGS. 1 and 2 are a vertical cross-sectional view and a horizontal cross-sectional view schematically showing a configuration of a film forming apparatus 1 as a substrate processing apparatus of the present embodiment, respectively. FIGS. 3 to 6 explain positions of a head 40, a surface potential system 50, a shield member 60, and a charge neutralization mechanism 80, which will be described later, in respective steps of a film forming process, respectively.

The film forming apparatus 1 shown in FIGS. 1 and 2 performs, as substrate treatment, the film forming process by sputtering. Specifically, the film forming apparatus 1 forms an MgO film on a wafer W, for example. The film forming apparatus 1 includes a processing chamber 10.

The processing chamber 10 is depressurizable and accommodates a wafer W as a substrate. The processing chamber 10 is made of, e.g., aluminum, and is connected to a ground potential. A gas exhaust unit 11 for reducing a pressure in a space S in the processing chamber 10 is connected to a bottom portion of the processing chamber 10 through an APC valve 12. In addition, a loading/unloading port 13 for the wafer W is formed on a sidewall of the processing chamber 10. The loading/unloading port 13 is provided with a gate valve 13a for opening and closing the loading/unloading port 13.

A mounting table 14 for horizontally mounting thereon the wafer W is disposed in the processing chamber 10. The mounting table 14 has a base 14a and an electrostatic chuck 14b.

The base 14a has a disc shape and is made of, e.g., aluminum. The base 14a is provided with a heater (not shown) for heating the wafer W. A cooling mechanism may be provided instead of the heater, or both of the heater and the cooling mechanism may be provided.

The electrostatic chuck 14b has a dielectric film and an electrode serving as an inner layer of the dielectric film. The electrostatic chuck 14b is disposed on the base 14a. A DC power supply (DC) 15 is connected to the electrode of the electrostatic chuck 14b. The wafer W mounted on the electrostatic chuck 14b is attracted and held on the electrostatic chuck 14b by an electrostatic attractive force. Hereinafter, an upper surface 14c of the electrostatic chuck 14b serving as a substrate attraction surface will be referred to as "wafer attraction surface 14c."

The mounting table 14 is connected to a driving mechanism 16 as a rotation driving unit. The driving mechanism 16 has, e.g., a supporting shaft 16a and a driving unit 16b.

The supporting shaft 16a extends vertically to penetrate through a bottom wall of the processing chamber 10. A sealing member SL1 is disposed between the supporting shaft 16a and the bottom wall of the processing chamber 10. The sealing member SL1 seals a space between the bottom wall of the processing chamber 10 and the supporting shaft 16a so that the supporting shaft 16a can rotate and move vertically. The sealing member SL1 is, e.g., a magnetic fluid seal. The upper end of the supporting shaft 16a is connected to a center of a bottom surface of the mounting table 14, and the lower end of the supporting shaft 16a is connected to the driving unit 16b.

The driving unit 16b generates a driving force for rotating and vertically moving the supporting shaft 16a. The mounting table 14 rotates about an axis AX1 as the supporting shaft 16a rotates about the axis AX1. The mounting table 14 moves vertically as the supporting shaft 16a moves vertically.

A target 20 made of Mg or a target 21 made of an activated metal such as Ti, Ta, or the like is disposed above the mounting table 14. The targets 20 and 21 are held by metal holders 20a and 21a. The holders 20a and 21a are supported at a ceiling portion of the processing chamber 10 through insulating members 20b and 21b, respectively. As will be described later, the target 21 is used to increase a vacuum level in the processing chamber 10 by a gettering action of the activated metal coated on an inner wall surface of the processing chamber 10.

Power supplies 22a and 22b are connected to the targets 20 and 21 through the holders 20a and 21a, respectively. The power supplies 22a and 22b are, e.g., DC power supplies. In addition, cathode magnets 23a and 23b are disposed outside the processing chamber 10 to face the targets 20 and 21 through the holders 20a and 21a, respectively. Magnet driving units (MD) 24a and 24b are connected to the cathode magnets 23a and 23b, respectively.

The film forming apparatus 1 further includes a gas supply unit 30 for supplying a gas into the processing chamber 10.

The gas supply unit 30 includes, e.g., a gas source (GS) 30a, a flow rate controller (FRC) 30b such as a mass flow controller or the like, and a gas inlet 30c. The gas source 30a stores a gas (e.g., Ar gas) that is excited in the processing chamber 10. The gas source 30a is connected to the gas inlet 30c through the flow rate controller 30b. The gas inlet 30c introduces a gas from the gas source 30a into the processing chamber 10.

When a gas is supplied from the gas supply unit 30 and a power is supplied from the power supply 22a or 22b to the corresponding target 20 or 21, the gas supplied into the processing chamber 10 is excited. When the corresponding cathode magnet 23a or 23b is driven by the magnet driving unit 24a or 24b, a magnetic field is generated around the target 20 or 21. Accordingly, plasma is concentrated near the target 20 or 21. Then, positive ions in the plasma collide with the target 20 or 21, so that a substance forming the target 20 or 21 is released from the corresponding target 20 or 21. As a result, Mg is deposited on the wafer W in the case of the target 20, and the activated metal coats the inner wall surface of the processing chamber 10 in the case of the target 21.

The film forming apparatus 1 includes the head 40.

The head 40 injects an oxidizing gas for oxidizing the Mg film formed on the wafer W toward the mounting table 14. The head 40 has, e.g., a circular shape in a plan view, and an area thereof in a plan view is greater than that of the wafer attraction surface 14c of the mounting table 14.

Figure 3:
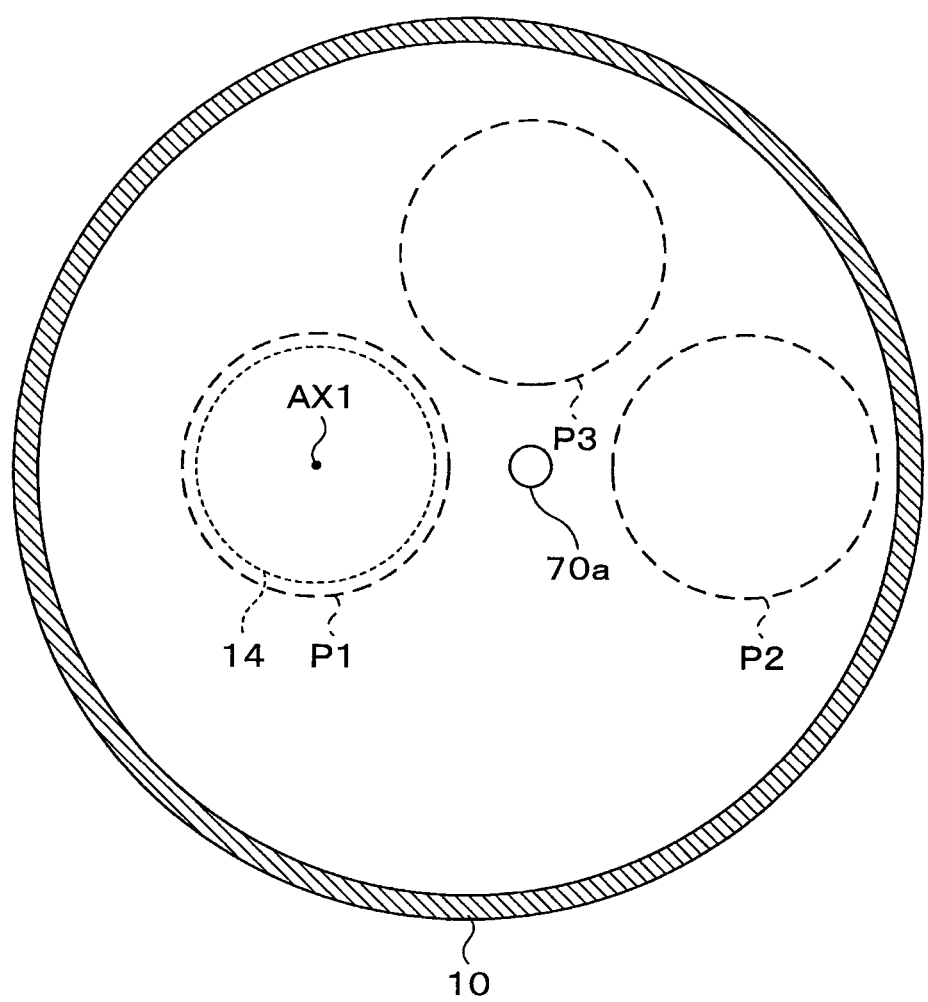
FIG. 3 explains positions of a head in respective steps of a film forming process using the film forming apparatus shown in FIG. 1.

As shown in FIG. 3, the head 40 moves between positions P1, P2, and P3 by an operation of a driving mechanism 70 to be described later. The position P1 is located above the mounting table 14 in the processing space S1 between the targets 20 and 21 and the mounting table 14. The position P2 is distant from the processing space S1 in the film forming apparatus 1 and is located in a space S2 different from the processing space S1. Specifically, the position P2 faces the position P1 with the supporting shaft 70a of the driving mechanism 70 to be described later interposed therebetween in a plan view. The position P3 is not overlapped with the position P2 in the space S2.

One end of a connecting portion 41 extending in a direction orthogonal to an axis AX2 of the supporting shaft 70a is connected to a peripheral portion of the head 40. The other end of the connecting portion 41 is connected to the supporting shaft 70a. A gas line GL1 for an oxidizing gas is formed in the head 40, the connecting portion 41, and the supporting shaft 70a. The end portion of the gas line GL1 opposite to the portion connected to the head 40 is located outside the processing chamber 10 and is connected to a gas supply unit 31. The gas supply unit 31 has, e.g., a gas source (GS) 31a and a flow rate controller (FRC) 31b such as a mass flow controller or the like. The gas source 31a stores an oxidizing gas (e.g., $O_2$ gas). The gas source 31a is connected to the gas line GL1 through the flow rate controller 31b.

In the head 40, the gas line GL1 is connected to a plurality of gas injection holes 40a formed at the head 40. The gas injection ports 40a are opened downward, i.e., toward the mounting table 14.

The film forming apparatus 1 further includes the surface potential system 50 as a charge amount measurement unit.

The surface potential system 50 measures the charge amount on the wafer attraction surface of the mounting table 14, i.e., the wafer attraction surface 14c of the electrostatic chuck 14b, in a non-contact manner. Specifically, the potential of the wafer attraction surface 14c is measured in a non-contact manner. More specifically, the surface potential system 50 measures, in a non-contact manner, a potential of a portion of the wafer attraction surface 14c that is exposed through an opening 60a of the shield member 60 to be described later. The measurement result of the surface potential system 50 is outputted to a controller (CNT) 100 to be described later. The charge amount at the portion exposed through the opening 60a on the wafer attraction surface 14c is calculated based on, e.g., the measurement result, the area of the opening 60a in a plan view, and the like.

Figure 4:
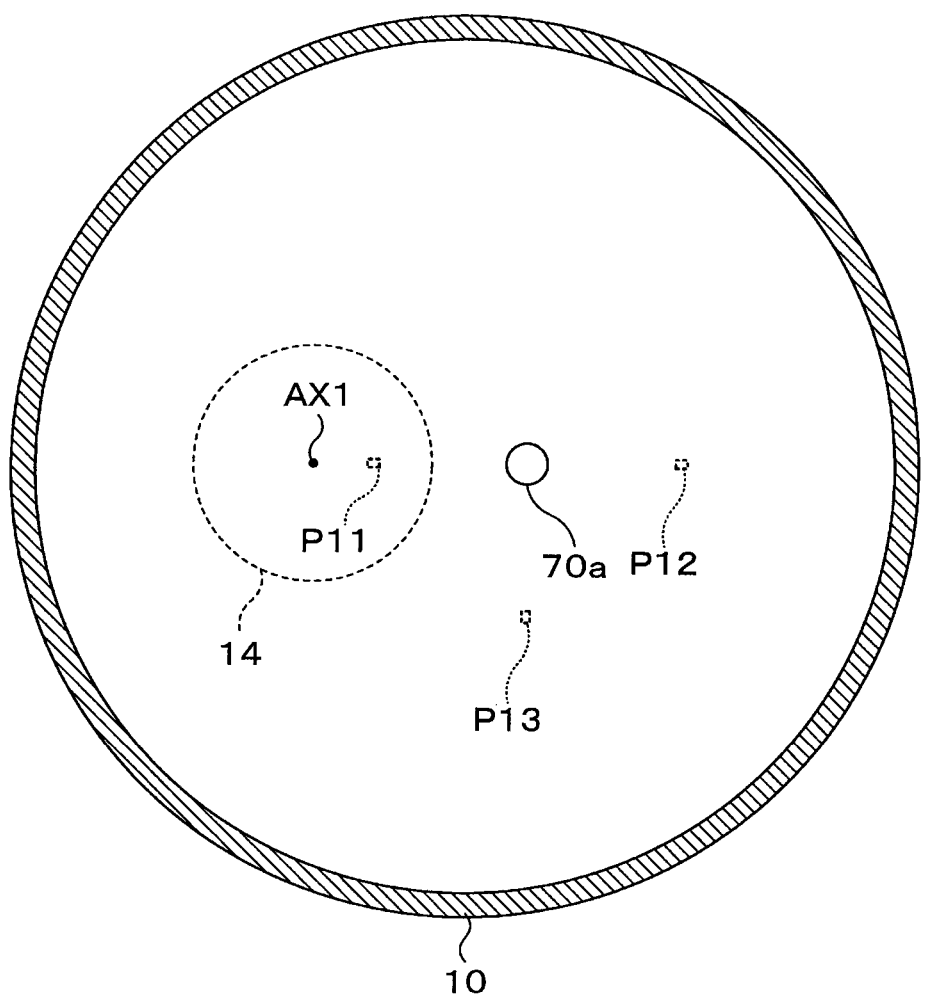
FIG. 4 explains positions of a surface potential system in respective steps of the film forming process using the film forming apparatus shown in FIG. 1.

As shown in FIG. 4, the surface potential system 50 is moved between positions P11, P12, and P13 by the operation of the driving mechanism 70 to be described later. The position P11 is located above the mounting table 14 in the processing space S1 between the targets 20 and 21 and the mounting table 14. The position P12 is distant from the processing space S1 in the film forming apparatus 1 and is located in a space S2 different from the processing space S1. Specifically, the position P12 faces the position P11 with the supporting shaft 70a of the driving mechanism 70 to be described later interposed therebetween in a plan view. The position P13 is not overlapped with the position P12 in the space S2.

The surface potential system 50 is disposed below one end of a supporting portion S1 extending in a direction orthogonal to the axis AX2 of the supporting shaft 70a. The supporting shaft 70a is connected to the other end of the supporting portion 51.

Further, the surface potential system 50 is disposed at a height position where the opening 60a of the shield member 60 to be described later is located in a measurement target region A of the surface potential system 50 in a plan view.

The film forming apparatus 1 further includes the shield member 60.

The shield member 60 can be disposed between the surface potential system 50 located at the position P11 and the wafer attraction surface 14c of the mounting table 14. The shield member 60 has an opening 60a whose area is smaller than that of the wafer attraction surface 14c in a plan view. The shield member 60 has, e.g., a circular shape in a plan view, and an area thereof in a plan view is greater than that of the wafer attraction surface 14c of the mounting table 14. The opening 60a has, e.g., a sector shape in a plan view. The opening 60a is formed such that a vertex 60b of the central angle of the sector coincides with the center of rotation of the mounting table 14, i.e., the axis AX1, in a plan view when the shield member 60 is located at a position P21 to be described later. Further, the opening 60a is formed such that the radial length of the sector is substantially equal to the radius of the attraction surface 14c. In the present embodiment, the central angle of the sector of the opening 60a is 90°. During the rotation of the mounting table 14, the potential of the portion of the wafer attraction surface 14c of the electrostatic chuck 14b that is exposed through the opening 60a is measured by the surface potential system 50. Accordingly, the potential in each of four regions obtained by equally dividing the wafer attraction surface 14c of the electrostatic chuck 14b in the circumferential direction can be measured.

The shield member 60 is made of a metal such as aluminum or the like and is connected to a ground potential.

Figure 5:
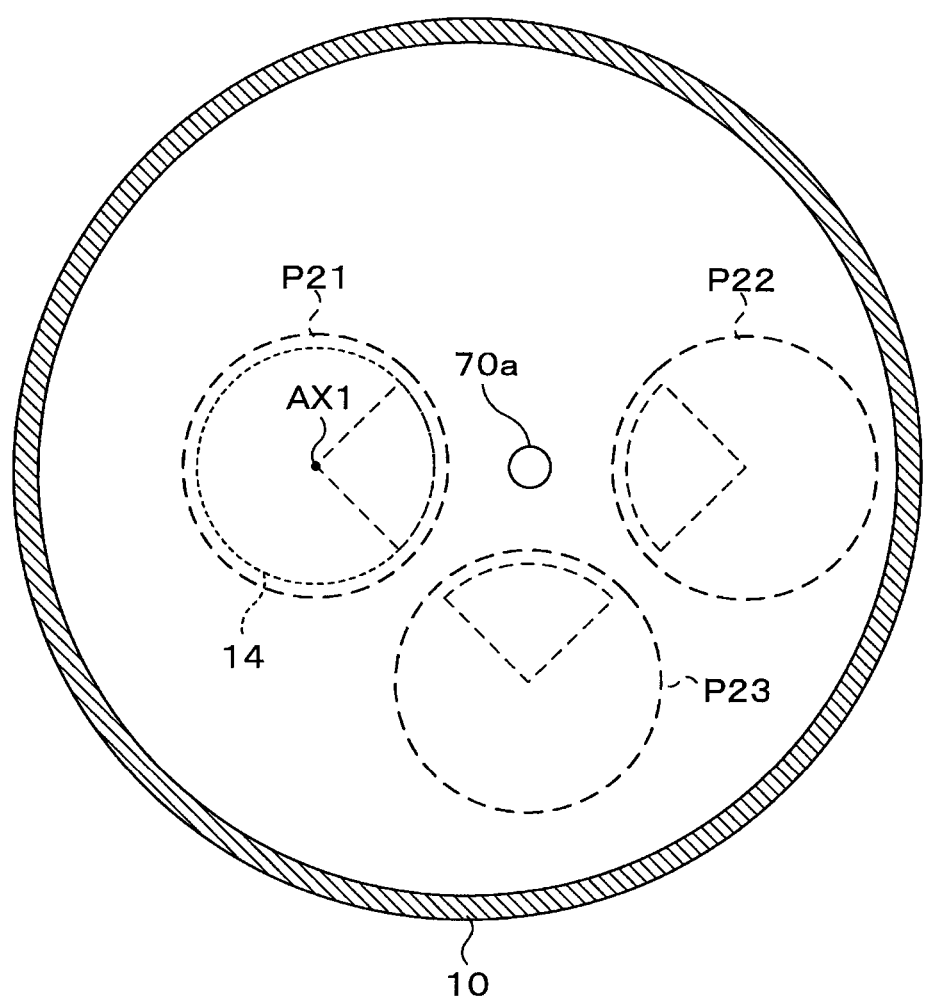
FIG. 5 explains positions of a shield member in respective steps of the film forming process using the film forming apparatus shown in FIG. 1.

As shown in FIG. 5, the shield member 60 is moved between positions P21, P22, and P23 by the operation of the driving mechanism 70 to be described later. The position P21 is located above the mounting table 14 in the processing space S1 between the targets 20 and 21 and the mounting table 14.

The position P22 is distant from the processing space S1 in the film forming apparatus 1 and is located in a space S2 different from the processing space S1. Specifically, the position P22 faces the position P21 with a supporting shaft 70a of the driving mechanism 70 to be described later interposed therebetween in a plan view. The position P23 is not overlapped with the position P22 in the space S2.

One end of a connecting portion 61 extending in a direction orthogonal to the axis AX2 of the supporting shaft 70a is connected to a peripheral portion of the shield member 60. The other end of the connecting portion 61 is connected to the supporting shaft 70a.

The film forming apparatus 1 further includes the driving mechanism 70 as a retreating mechanism.

The driving mechanism 70 has, e.g., a supporting shaft 70a and a driving unit 70b.

The supporting shaft 70a extends along the axis AX2. The axis AX2 is substantially parallel to the axis AX1, and extends vertically at the side of the mounting table 14. The distance between the axis AX2 and the center position of the head 40 and the distance between the axis AX2 and the center position of the shield member 60 are substantially equal to the distance between the axis AX2 and the axis AX1.

The supporting shaft 70a extends vertically to penetrate through the bottom wall of the processing chamber 10. A sealing member SL2 is disposed between the supporting shaft 70a and the bottom wall of the processing chamber 10. The sealing member SL2 seals a space between the bottom wall of the processing chamber 10 and the supporting shaft 70a so that the supporting shaft 70a can rotate and move vertically. The sealing member SL2 is, e.g., a magnetic fluid seal.

The supporting portion 51, the connecting portion 41, and the connecting portion 61 are connected to the side surface of the supporting shaft 70a in that order from top to bottom. The supporting portion 51 and the connecting portion 61 are connected to one side surface of the supporting shaft 70a, and the connecting portion 41 is connected to the other side surface of the supporting shaft 70a. The driving unit 70b is connected to the lower end of the supporting shaft 70a.

The driving unit 70b generates a driving force for rotating and vertically moving the supporting shaft 70a. As the supporting shaft 70a rotates about the axis AX2, the head 40, the surface potential system 50, and the shield member 60 rotate about the axis AX2. As the supporting shaft 70a moves vertically, the head 40, the surface potential system 50, and the shield member 60 move vertically.

The film forming apparatus 1 further includes the charge neutralization mechanism 80.

The charge neutralization mechanism 80 performs charge neutralization on the wafer attraction surface 14c of the mounting table 14. In the present embodiment, the charge neutralization mechanism 80 performs the charge neutralization using an ionized gas.

Figure 6:
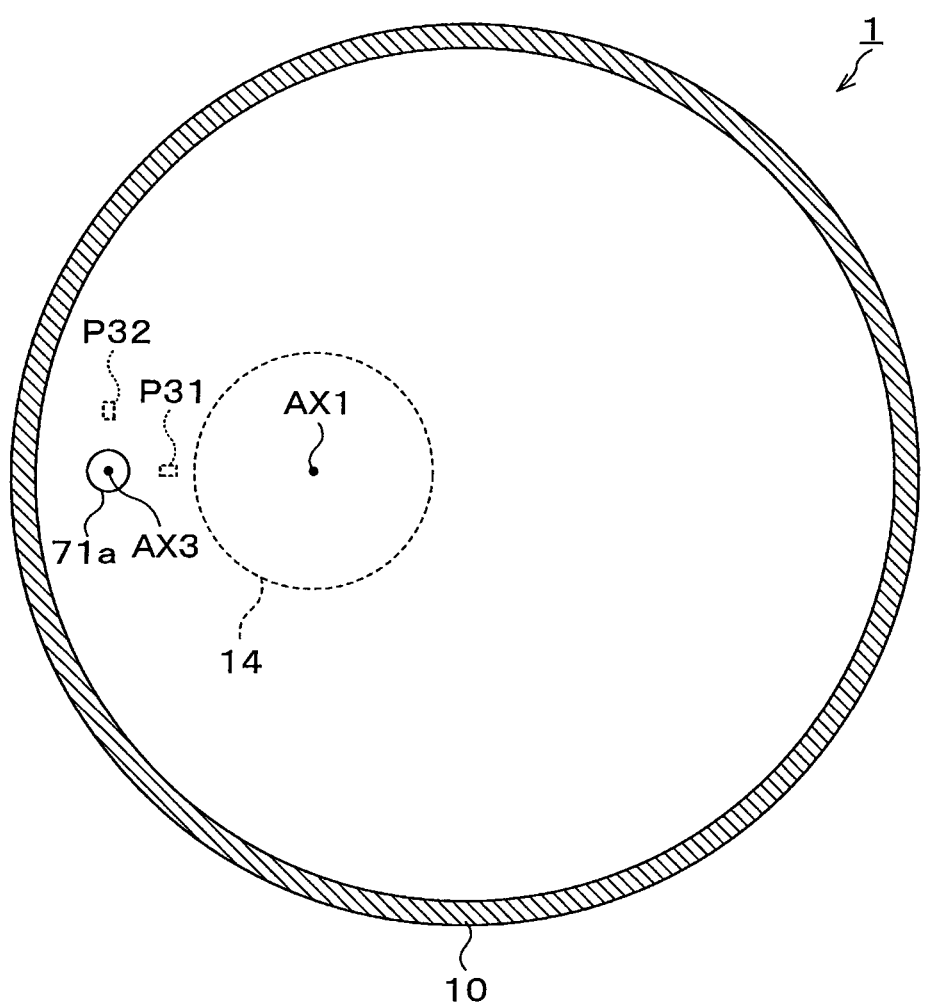
FIG. 6 explains positions of a charge neutralizer in respective steps of the film forming process using the film forming apparatus shown in FIG. 1.

As shown in FIG. 6, the charge neutralization mechanism 80 moves between positions P31 and P32 by an operation of a driving mechanism 71 to be described later. When the charge neutralization mechanism 80 is located at the position P31, the tip end of the charge neutralization mechanism 80 faces the mounting table 14. The position P31 is close to the mounting table 14. The position P32 is distant from the processing space S1 between the targets 20 and 21 and the mounting table 14 in the film forming apparatus 1. The positon P32 is located in a space S2 different from the processing space S1. The position P32 is far from the mounting table 14 compared to the position P31.

One end of a connecting portion 81 extending in a direction orthogonal to an axis AX3 of a supporting shaft 71a of the driving mechanism 71 to be described later is connected to the base of the charge neutralization mechanism 80. The other end of the connecting portion 81 is connected to the supporting shaft 71a. A gas line GL2 for an ionized gas is formed at the connecting portion 81 and the supporting shaft 71a. One end of the gas line GL2 is connected to the charge neutralization mechanism 80. The other end of the gas line GL2 is located outside the processing chamber 10 and is connected to a gas supply unit 32. The gas supply unit 32 has, e.g., a gas source (GS) 32a and an ionization unit (IU) 32b. The gas source 32a stores an ionization gas (e.g., $N_2$ gas). The gas source 32a is connected to the gas line GL2 through the ionization unit 32b. The ionization unit 32b ionizes the ionization gas from the gas source 32a by corona discharge, UV irradiation, soft X-ray irradiation, or the like to generate an ionized gas. The generated ionized gas is supplied to the charge neutralization mechanism 80 through the gas line GL2 and is discharged from the tip end of the charge neutralization mechanism 80 toward the mounting table 14.

The film forming apparatus 1 further include the driving unit 71.

The driving unit 71 has, e.g., the supporting shaft 71a and a driving unit (DU) 71b.

The supporting shaft 71a extends along the axis AX3. The axis AX3 is substantially parallel to the axis AX1 and the axis AX2 and extends vertically on the side of the mounting table 14 opposite to the supporting shaft 70a side.

Further, the supporting shaft 71a extends vertically to penetrate through the bottom wall of the processing chamber 10. A sealing member SL3 is disposed between the supporting shaft 71a and the bottom wall of the processing chamber 10. The sealing member SL3 seals the space between the bottom wall of the processing chamber 10 and the supporting shaft 71a so that the supporting shaft 71a can rotate. The sealing member SL3 is, e.g., a magnetic fluid seal.

The connecting portion 81 is connected to an upper end of the supporting shaft 71a. The driving unit 71b is connected to a lower end of the supporting shaft 71a.

The driving unit 71b generates a driving force for rotating the supporting shaft 71a. As the supporting shaft 71a rotates about the axis AX3, the charge neutralization mechanism 80 rotates about the axis AX3.

The film forming apparatus 1 further includes a controller 100. The controller 100 is, e.g., a computer including a CPU, a memory, and the like, and has a program storage unit (not shown). The program storage unit stores a program for controlling the driving units 16b, 70b and 71b and the like to perform a film forming process to be described later in the film forming apparatus 1. The program is recorded in a computer-readable storage medium and may be installed in the controller 100 from the storage medium. A part or the entire program may be realized by a dedicated hardware (circuit board).

Figure 7:
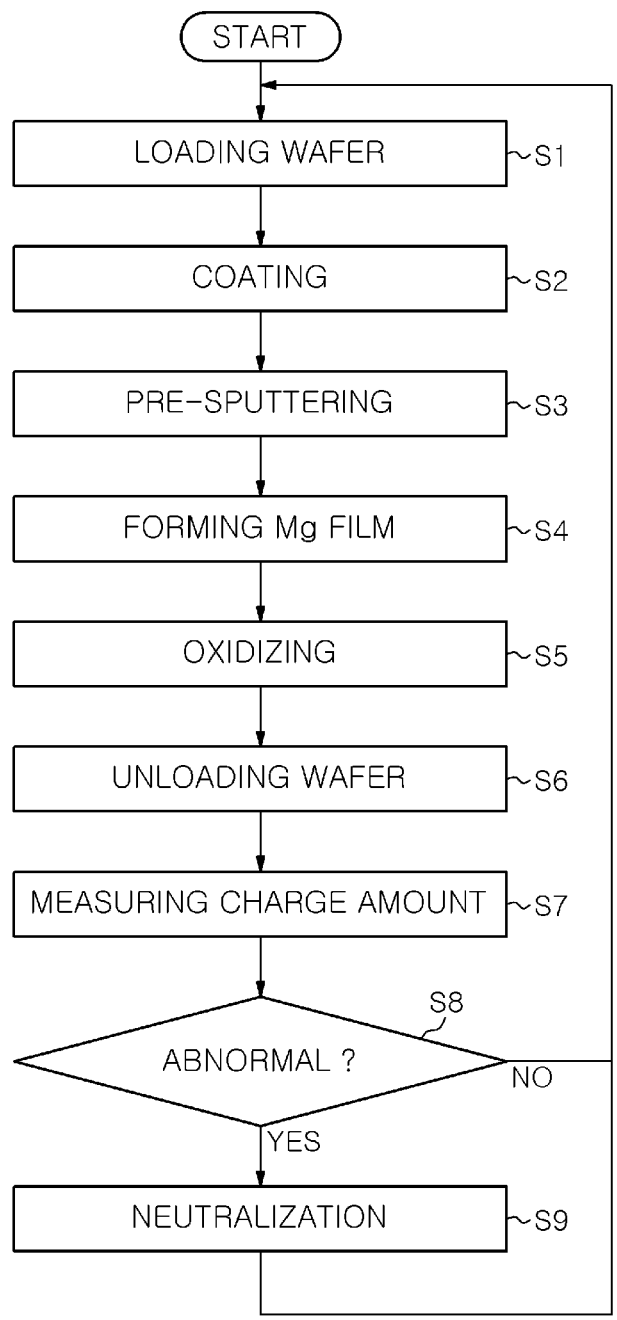
FIG. 7 is a flowchart for explaining the film forming process using the film forming apparatus shown in FIG. 1.
Figure 8:
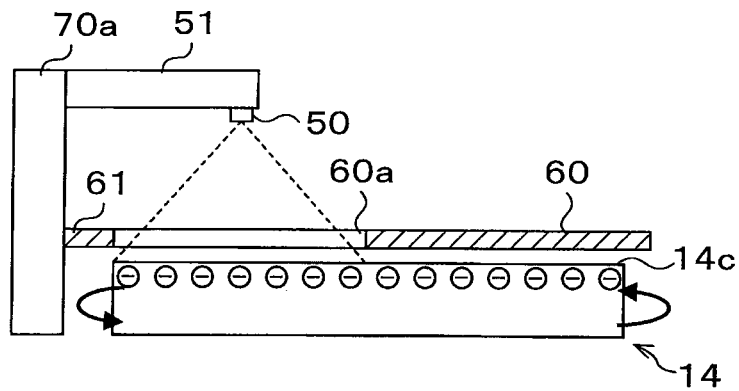
FIG. 8 shows a state in a processing chamber during a charge amount measuring process.
Figure 9:
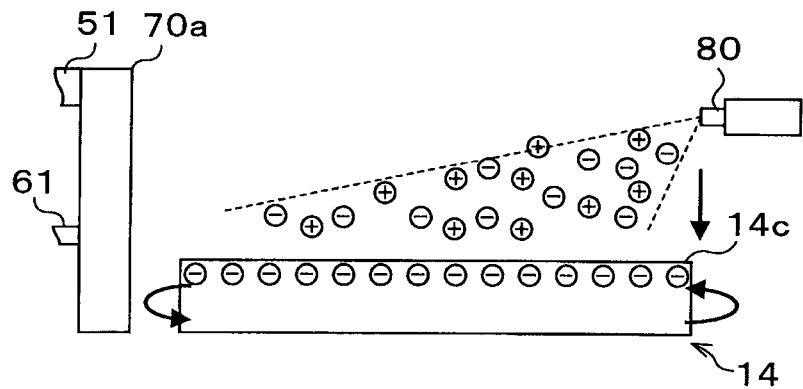
FIG. 9 shows a state in the processing chamber in a charge neutralization process.

Next, a film forming process using the film forming apparatus 1 will be described with reference to FIGS. 7 to 9. FIG. 7 is a flowchart for explaining the film forming process. FIG. 8 shows a state in the processing chamber 10 during a charge amount measuring process to be described later. FIG. 9 shows a state in the processing chamber 10 during a charge neutralization process to be described later. Before the film forming process is started, the head 40 is located at the position P3; the surface potential system 50 is located at the position P13; the shield member 60 is located at the position P23; and the charge neutralization mechanism 80 is located at the position P32.

(Loading)

As shown in FIG. 7, first, the wafer W is loaded into the processing chamber 10 whose inner pressure is adjusted to a predetermined pressure (step S1). Specifically, the gate valve 13a is opened, and a transfer mechanism (not shown) holding the wafer W is moved from a transfer chamber (not shown) in a vacuum atmosphere adjacent to the processing chamber 10 into the processing chamber 10 through the loading/unloading port 13. Then, the wafer W is transferred to a position above the mounting table 14. Next, the wafer W is transferred to the raised support pins (not shown). Thereafter, the transfer mechanism retreats from the processing chamber 10, and the gate valve 13a is closed. At the same time, the support pins are lowered, and the wafer W is mounted on the mounting table 14 and attracted and held on the electrostatic chuck 14b by the electrostatic attractive force.

(Coating)

Next, the inner wall surface of the processing chamber 10 is coated (step S2). Specifically, the driving mechanism 70 is controlled such that the head 40 is located at the position P1; the surface potential system 50 is located at the position P12; and the shield member 60 is located at the position P22.

The position of the charge neutralization mechanism 80 is maintained at the position P32. A gas is supplied from the gas supply unit 30 into the processing chamber 10, and a power is supplied from the power supply 22*b* to the target 21. A magnetic field is generated by the magnet 23*b*. At this time, the flow rate of the gas supplied from the gas supply unit 30 is, e.g., 10 sccm to 500 sccm, and the power supplied from the power supply 22*b* to the target 21 is, e.g., 50 W to 1000 W.

In this coating process, plasma is generated to be concentrate below the target 21. Due to collision between positive ions in the generated plasma and the target 21, an activated metal is released from the target 21. The inner wall surface of the processing chamber 10 is coated with the activated metal. The vacuum level in the processing chamber 10 is increased due to the gettering action of the coated activated metal. Accordingly, a high-quality MgO layer can be formed. In the coating process, the head 40 is located at the position P1 and the wafer W is covered with the head 40, so that the contamination of the wafer W can be reduced or prevented.

(Pre-Sputtering)

Next, pre-sputtering is performed (step S3). Specifically, the gas is supplied from the gas supply unit 30 into the processing chamber 10 and the power is supplied from the power supply 22*a* to the target 20 in a state where the head 40 is located at the position P1; the surface potential system 50 is located at the position P12; the shield member 60 is located at the position P22; and the charge neutralization mechanism 80 is located at the position P32. Further, a magnetic field is generated by the cathode magnet 23*a*. At this time, the flow rate of the gas supplied from the gas supply unit 30 is, e.g., 10 sccm to 500 sccm, and the power supplied from the power supply 22*a* to the target 20 is, e.g., 50 W to 1000 W.

In the pre-sputtering process, plasma is generated and concentrated below the target 20. Then, the surface of the target 20 is etched due to collision between positive ions in the generated plasma and the target 20. Therefore, the surface of the target 20 that may be contaminated during another process can be removed. Accordingly, in a film forming process to be described later, an Mg film with less contamination can be formed. In the pre-sputtering process, the head 40 is located at the position P1 and the wafer W is covered by the head 40, so that the contamination of the wafer W can be reduced or prevented.

(Mg Film Formation)

Next, an Mg film is formed by sputtering (step S4). Specifically, the driving mechanism 70 is controlled such that the head 40 is located at the position P3; the surface potential system 50 is located at the position P13; and the shield member 60 is located at the position P23. The position of the charge neutralization mechanism 80 is maintained at the position P32. In this state, the mounting table 14 is rotated by the driving mechanism 16, and the gas is supplied from the gas supply unit 30 into the processing chamber 10. Further, the power is supplied from the power supply 22*a* to the target 20, and a magnetic field is generated by the cathode magnet 23*a*. At this time, the rotation speed of the mounting table 14 is, e.g., 30 rpm to 300 rpm; the flow rate of the gas supplied from the gas supply unit 30 is, e.g., 10 sccm to 500 sccm; and the power supplied from the power supply 22*a* to the target 20 is, e.g., 50 W to 1000 W.

In the Mg film forming process, plasma is generated and concentrated below the target 20. Mg is released from the surface of the target 20 due to collision between positive ions in the generated plasma and the target 20. Accordingly, an Mg film is formed on the wafer W. In the Mg film forming process, the surface potential system 50 that has retreated from the position P11 as the measurement position is located at the position P13, so that it is possible to prevent the Mg film formation from being hindered by the surface potential system 50.

(Oxidation)

Next, the Mg film formed on the wafer W is oxidized (step S5). Specifically, the driving mechanism 70 is controlled such that the head 40 is located at the position P1; the surface potential system 50 is located at the position P12; and the shield member 60 is located at the position P22. The position of the charge neutralization mechanism 80 is maintained at the position P32. In this state, the mounting table 14 is rotated by the driving mechanism 16, and the oxidizing gas is supplied from the gas supply unit 31 to the head 40. At this time, the rotation speed of the mounting table 14 is, e.g., 30 rpm to 300 rpm; the flow rate of the oxidizing gas is, e.g., 10 sccm to 2000 sccm; and the temperature of the oxidizing gas is, e.g., 50° C. to 300° C.

In the oxidation process, the Mg film formed on the wafer W is oxidized by the oxidizing gas injected from the head 40 toward the mounting table 14. Accordingly, an MgO film is formed.

The above-described steps S3 to S5 may be repeatedly performed in that order.

(Unloading)

Next, the wafer W is unloaded from the processing chamber 10 (step S6). Specifically, the driving mechanism 70 is controlled such that the head 40 is located at the position P3; the surface potential system 50 is located at the position P13; and the shield member 60 is located at the position P23. The position of the charge neutralization mechanism 80 is maintained at the position P32. Then, the attraction and holding of the wafer W by the electrostatic attractive force of the electrostatic chuck 14*b* is released. The support pins (not shown) are raised, and the wafer W is transferred onto the support pins. The gate valve 13*a* is opened, and the transfer mechanism (not shown) is moved from the transfer chamber (not shown) in a vacuum atmosphere adjacent to the processing chamber 10 into the processing chamber 10 through the loading/unloading port 13. Next, the support pins are lowered, and the wafer W is transferred to the transfer mechanism. Thereafter, the transfer mechanism transfers the wafer W to the outside of the processing chamber 10 through the loading/unloading port 13. Then, the gate valve 13*a* is closed.

(Charge Amount Measurement)

Next, the charge amount on the wafer attraction surface 14*c* of the electrostatic chuck 14*b* is measured (step S7). Specifically, the driving mechanism 70 is controlled such that the head 40 is located at the position P2; the surface potential system 50 is located at the position P11; and the shield member 60 is located at the position P21. The position of the charge neutralization mechanism 80 is maintained at the position P32.

In this state, the mounting table 14 is rotated by the driving mechanism 16 so that the portion of the wafer attraction surface 14*c* that is exposed through the opening 60*a* to the surface potential system 50 is switched. Then, the surface potential system 50 performs measurement in synchronization with the rotation (e.g., whenever the mounting table 14 makes ¼ rotation). Specifically, as shown in FIG. 8, the potential of the portion of the wafer attraction surface 14*c* of the electrostatic chuck 14*b* that is exposed through the opening 60*a* is sequentially measured by the surface potential system 50. Accordingly, the surface potential in each of four regions (hereinafter, referred to as "divided regions") obtained by equally dividing the wafer attraction surface 14c of the electrostatic chuck 14b in the circumferential direction is measured. Then, the controller 100 calculates the charge amount for each divided region based on the measured surface potential and the area of the opening 60a. In other words, the controller 100 obtains the charge distribution on the wafer attraction surface 14c of the electrostatic chuck 14b based on the measurement result of the surface potential system 50 and the area of the opening 60a.

(Abnormal Charging Determination)

Next, it is determined whether or not the electrostatic chuck 14b is abnormal based on the charge distribution on the wafer attraction surface 14c of the electrostatic chuck 14b (step S8). Specifically, the controller 100 determines whether or not there is a divided region on the wafer attraction surface 14c of the electrostatic chuck 14b where the charge amount exceeds a threshold value pre-stored in a storage unit (not shown).

If the electrostatic chuck 14b is normal, specifically, if there is no divided region where the charge amount exceeds the threshold value on the wafer attraction surface 14c of the electrostatic chuck 14b, the processing returns to step S1 and a next wafer W to be processed is loaded. The processing returns to step S1 after the driving mechanism 70 is controlled such that the head 40 is located at the position P3; the surface potential system 50 is located at the position P13; and the shield member 60 is located at the position P23.

(Charge Neutralization)

On the other hand, if the electrostatic chuck 14b is abnormal, specifically, if there is a divided region on the wafer attraction surface 14c of the electrostatic chuck 14b where the charge amount exceeds the threshold value, the charge neutralization is performed on the wafer attraction surface 14c (step S9). For example, the driving mechanism 70 is controlled such that the head 40 is located at the position P3; the surface potential system 50 is located at the position P13; and the shield member 60 is located at the position P23, and the driving mechanism 71 is controlled such that the position of the charge neutralization mechanism 80 is maintained at the position P31. In this state, the mounting table 14 is rotated by the driving mechanism 16. Then, the ionized gas is supplied from the gas supply unit 32 to the charge neutralization mechanism 80.

In the charge neutralization process, the charge neutralization is performed on the wafer attraction surface 14c of the electrostatic chuck 14b by the ionized gas injected from the charge neutralization mechanism 80 toward the mounting table 14 as shown in FIG. 9.

Then, the driving mechanism 71 is controlled such that the charge neutralization mechanism 80 is located at the position P32. Thereafter, the processing returns to step S1, and a next wafer W to be processed is loaded.

As described above, the film forming apparatus 1 of the present embodiment includes the charge neutralization mechanism 80 for neutralizing charges on the wafer attraction surface 14c. Since the charge neutralization mechanism 80 can neutralize charges on the wafer attraction surface, it possible to prevent a problem that occurs when the wafer W is chucked on the electrostatic chuck 14b of the mounting table 14 or when the wafer W is dechucked from the electrostatic chuck 14b. The film forming apparatus 1 further includes the surface potential system 50 for measuring the charge amount on the wafer attraction surface 14c of the mounting table 14. Therefore, the charges on the wafer attraction surface 14c can be neutralized depending on the charging state of the wafer attraction surface 14c. Since it is not necessary to perform the charge neutralization for each wafer W, the decrease in the throughput can be suppressed. The film forming apparatus 1 further includes the driving mechanism 70 for making the surface potential system 50 retreat from the position P11 as the measurement position facing the wafer attraction surface 14c. Therefore, the Mg film formation is not hindered by the surface potential system 50.

In the present embodiment, the film forming apparatus 1 includes the shield member 60 having the opening 60a and the driving mechanism 16. In the charge amount measuring process, the driving mechanism 16 rotates the mounting table 14 so that the portion of the wafer attraction surface 14c that is exposed through the opening 60a of the shield member 60 to the surface potential system 50 located at the position P11 is switched. The surface potential system 50 measures the charge amount, specifically, the potential of the portion of the wafer attraction surface 14c that is exposed through the opening 60a of the shield member 60. Therefore, the film forming apparatus 1 can obtain the charge amount distribution on the wafer attraction surface 14c. Accordingly, the wafer W can be prevented from being damaged during dechucking due to local charging on the wafer attraction surface 14c.

Further, in the present embodiment, the driving mechanism 70 of the head 40 for oxidation serves as the retreating mechanism for making the surface potential system 50 and the shield member 60 retreat from the processing space S1 (specifically, the position P11 or P21) above the mounting table 14. Therefore, it is possible to suppress the scaling up of the film forming apparatus 1. Alternatively, the driving mechanism 70 of the head 40 for oxidation may serve as the retreating mechanism for only one of the surface potential system 50 and the shield member 60. In the present embodiment, since the surface potential system 50 or the shield member 60 retreats from the processing space S1 above the mounting table 14, a moving mechanism for horizontally moving the mounting table 14 is not required and, thus, the conventional film forming apparatus can be used.

In the present embodiment, the opening 60a of the shield member 60 has a sector shape in a plan view, and the vertex 60b of the central angle of the sector of the opening 60a coincides with the axis AX1 that is the center of rotation of the mounting table 14 by the driving mechanism 16. Therefore, the charge amount in the divided regions obtained by equally dividing the wafer attraction surface 14c in the circumferential direction can be measured by synchronizing the rotation of the mounting table 14 by the driving mechanism 16 with the measurement timing of the surface potential system 50. The divided regions have no overlapping portions. In the case of calculating the charge amount based on the measurement result of the surface potential system 50, the calculated charge amount is an average value within a potential measurement range. Therefore, if the charge amount measurement regions are overlapped unlike the present embodiment, it is difficult to accurately detect the charging state of the wafer attraction surface 14c. Accordingly, in the present embodiment, the charging state of the wafer attraction surface 14c can be detected more accurately.

Further, in the present embodiment, since the shield member 60 is made of a metal and is grounded, the measurement result of the surface potential system 50 is not affected by the shield member 60. Accordingly, the charging state of the surface 14c can be accurately detected.

Figure 10:
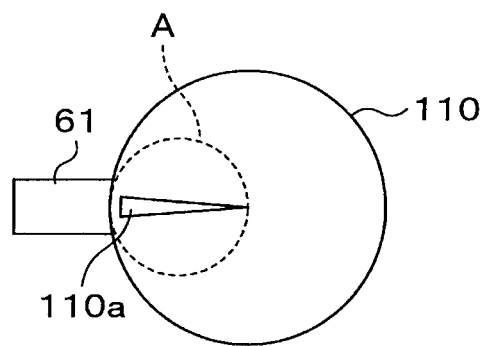
FIG. 10 is a plan view showing another example of the shield member.

FIG. 10 is a plan view showing another example of the shield member.

The shield member 60 shown in FIG. 2 has the sector-shaped opening 60a having a central angle of 90° in a plan view. However, the shape of the opening is not limited thereto. For example, the opening may have a sector shape having a central angle of 10° in a plan view as in the case of an opening 110a of the shield member 110 shown in FIG. 10. Similarly to the opening 60a, the opening 110a is formed such that the vertex of the central angle of the sector in a plan view coincides with the center of rotation of the mounting table 14 in a plan view. By using the shield member 110, it is possible to detect the charge amount in each of 36 divided regions obtained by equally dividing the wafer attraction surface 14c in the circumferential direction.

By using a shield member having a sector-shaped opening, e.g., the opening 110a, with a small central angle in a plan view, it is possible to obtain more accurate charge distribution on the wafer attraction surface 14c of the electrostatic chuck 14b. Therefore, extremely local charging on the wafer attraction surface 14c can be detected, which makes it possible to prevent defective dechucking caused by the extremely local charging.

When the opening of the shield member has a sector shape in a plan view, an arc portion of the sector may be straight, or radially extending portions may be curved.

Figure 11:
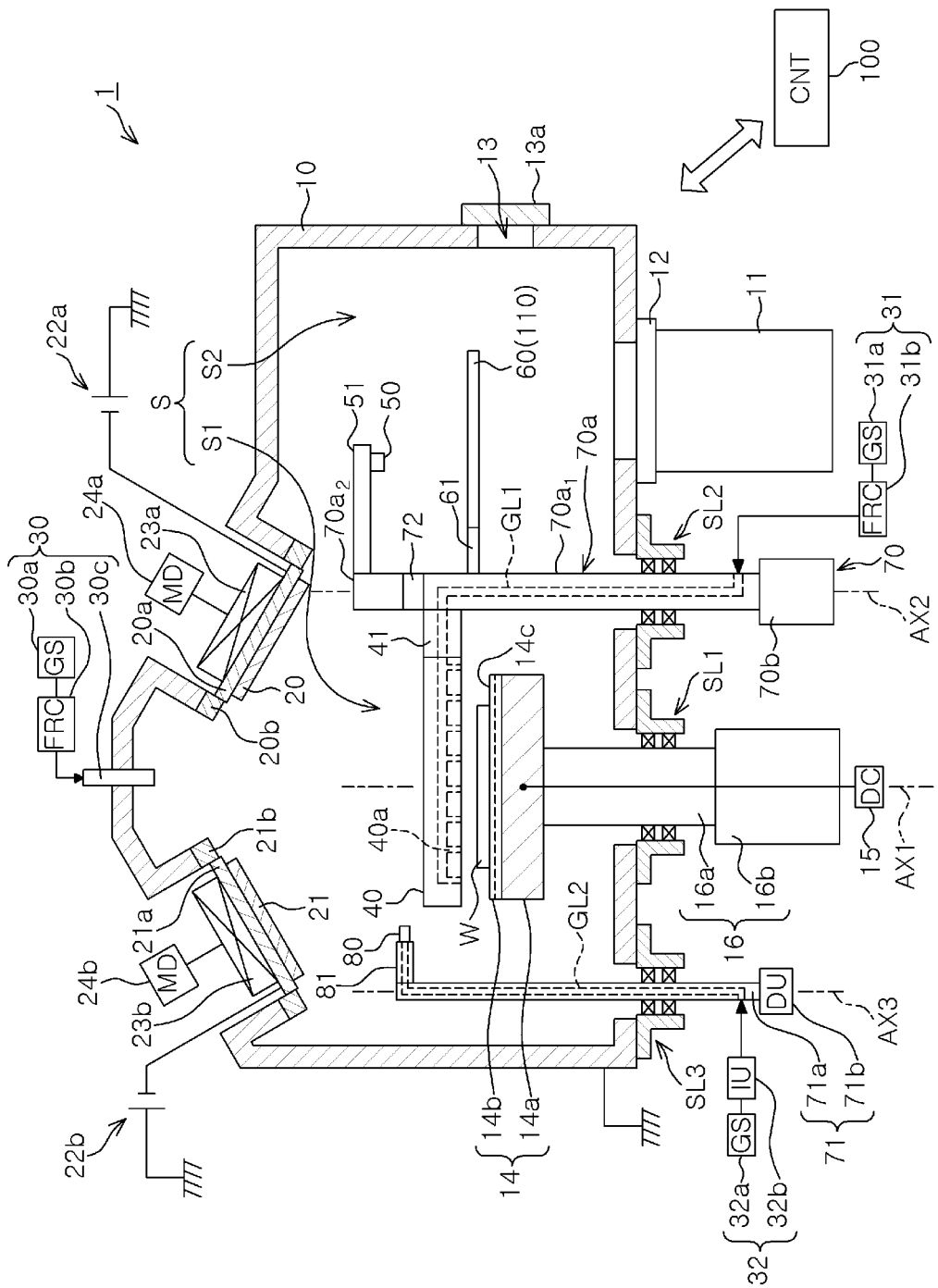
FIG. 11 is a vertical cross-sectional view schematically showing a configuration of a film forming apparatus in which a shield member can be replaced.

FIG. 11 is a vertical cross-sectional view schematically showing a configuration of a film forming apparatus 1a in which the shield member 60 shown in FIG. 2 and the shield member 110 shown in FIG. 10 can be replaced.

In the film forming apparatus 1a shown in FIG. 11, the supporting shaft 70a is divided into an upper supporting shaft 70ai and a lower supporting shaft 70a2. The head 40 is fixed to the lower supporting shaft 70ai, and one of the shield members 60 and 110 is detachably fixed to the lower supporting shaft 70ai. The surface potential system 50 is fixed to the upper supporting shaft 70a2.

The lower supporting shaft 70ai and the upper supporting shaft 70a2 are connected through a driving unit 72. The driving unit 72 generates a driving force for vertically moving the supporting shaft 70a2. As the supporting shaft 70a2 moves vertically, the distance between the surface potential system 50 and the shield member 60 or 110 changes.

Since the size of the measurement target region A of the surface potential system 50 is determined by the distance from the surface potential system 50 to a measurement target, the position of the surface potential system 50 is changed in response to the size of the opening of the shield member. For example, in the case of the shield member 60 having the large opening 60a, the surface potential system 50 is located distant from the shield member 69 so that the measurement target region A becomes large as shown in FIG. 2. In the case of the shield member having the small opening 110a, the surface potential system 50 is located close to the shield member 110 so that the measurement target region A becomes small.

If the shield members having openings with different sizes can be replaced as in this example, the resolution in detecting the charge amount on the wafer attraction surface 14c can be changed.

Instead, a shield member having a variable opening size may be provided.

By providing the driving unit 72 for generating a driving force for vertically moving the supporting shaft 70a2 to which the surface potential system 50 is fixed, it is possible to measure a potential of a wafer in accordance with a diameter of the wafer in the case where neither the shield member 60 nor the shield member 110 is installed.

In the above description, when the wafer attraction surface 14c of the electrostatic chuck 14b is abnormal, the charge neutralization mechanism 80 performs charge neutralization on the entire wafer attraction surface 14c. Alternatively, the charge neutralization mechanism 80 may perform charge neutralization only on a divided region of the wafer attraction surface 14c where the charging abnormality has occurred. Specifically, the driving mechanism 16 is controlled such that the divided region of the wafer attraction surface 14c where the charging abnormality has occurred is positioned below the charge neutralization mechanism 80 located at the position P31. In addition, the moving mechanism for vertically moving the neutralization mechanism 80 is provided to move the charge neutralization mechanism 80 close to the wafer attraction surface 14c. Accordingly, the charge neutralization can be performed only on the divided region of the wafer attraction surface 14c where the charging abnormality has occurred by the ionized gas from the charge neutralization mechanism 80.

In the above description, the charge amount on the wafer attraction surface 14c is measured for each wafer W. However, the measurement may be performed for a predetermined number of wafers, e.g., two or more wafers.

Undesirable charging is more likely to occur on an electrostatic chuck using Johnson-Rahbek force than on an electrostatic chuck using Coulomb force. Therefore, the charge amount is measured for each wafer in the case of the former electrostatic chuck that is often used in a high-temperature region (wafer temperature: 150° C. to 400° C.), and the charge amount is measured for every 50 wafers in the case of the latter electrostatic chuck that is often used in a low-temperature region (wafer temperature: −173° C. to a room temperature).

In the above description, the ionized gas is supplied from the charge removing mechanism 80 to neutralize charges on the wafer attraction surface 14c. However, the charge neutralization method is not limited thereto. For example, the gas in the processing chamber 10 may be ionized by UV irradiation or the like, and the charges may be neutralized by the ionized gas thus generated.

While the apparatus for forming an MgO film has been described as an example, the present disclosure can be applied to another film forming apparatus. Further, the present disclosure can be applied to a substrate processing apparatus including an electrostatic chuck and configured to perform substrate treatment other than the film formation.

In the above-described example, the supporting portion 51 and the connection portions 41 and 61 are connected to the supporting shaft 70a, and the surface potential system 50, the head 40, and the shield member 60 are integrally rotated. However, the surface potential system 50, the head 40, and the shield member 60 may be independently rotated. In order to independently rotate the surface potential system 50, the head 40, and the shield member 60, it is considered to concentrically arrange two cylindrical supporting shafts about one supporting shaft and to connect the supporting portion 51 and the connection portions 41 and 61 to the supporting shaft and the two cylindrical supporting shafts, respectively. By independently rotating the surface potential system 50, the head 40, and the shield member 60, the position P2 as a standby position of the head 40 at the time of measuring the charge amount, or the position P12 or P22 as a standby position of the surface potential system 50 or the shield member 60 at the time of coating or the like can be omitted. Accordingly, the size of the processing chamber can be reduced.

In the above-described embodiment, the charge amount is measured after the unloading of the wafer. However, the charge amount may be measured before the loading of the wafer, such as start of processing of a processing lot, or the like. By measuring the charge amount before the loading of the wafer, the initial state of the electrostatic attraction surface can be detected. Accordingly, the wafer can be prevented from being loaded in an abnormal charging state.

In the above embodiment, the charge amount on the electrostatic chuck is measured in a state where no wafer is mounted. However, the charge amount may be measured in a state where the wafer is loaded and mounted on the electrostatic chuck. Therefore, the amount of charges moved from the wafer to the electrostatic chuck can be monitored. Accordingly, it is possible to more effectively suppress defective dechucking.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

The following configurations are also included in the technical scope of the present disclosure.

(1) There is provided a substrate processing apparatus for processing a substrate, comprising: a processing chamber accommodating the substrate, a mounting table disposed in the processing chamber and configured to attract and hold the substrate using an electrostatic attractive force; a charge amount measurement unit disposed in the processing chamber and configured to measure charge amount of a substrate attraction surface of the mounting table; a charge neutralization mechanism configured to neutralize the substrate attraction surface of the mounting table; and a retreating mechanism configured to make the charge amount measurement unit retreat from a measurement position facing the substrate attraction surface of the mounting table.

With the configuration (1), the charge neutralization mechanism is provided to perform charge neutralization on the substrate attraction surface, so that it is possible to prevent a problem that occurs during chucking or dechucking of the substrate due to the electrostatic attractive force of the mounting table. Further, since the substrate processing apparatus includes the charge amount measurement unit, it is possible to perform charge neutralization on the substrate attraction surface depending on the charging state of the substrate attraction surface and, thus, it is not necessary to perform the charge neutralization for each substrate or the like. Accordingly, a decrease in the throughput can be suppressed. Further, since the substrate processing apparatus includes the retreating mechanism for making the charge amount measurement unit retreat from the measurement position facing the substrate attraction surface, the substrate treatment is not hindered by the charge amount measurement unit.

(2) In the substrate processing apparatus of the configuration (1), the substrate processing apparatus further comprises a shield member disposable between the charge amount measurement unit located at the measurement position and the mounting table and provided with an opening smaller than the substrate attraction surface of the mounting table; and a rotation driving unit configured to rotate the mounting table. Further, the rotation driving unit may rotate the mounting table so that a portion of the substrate attraction surface of the mounting table that is exposed through the opening of the shield member to the charge amount measurement unit located at the measurement position is switched, and the charge amount measurement unit may sequentially perform the measurement on the portion of the substrate attraction surface of the mounting table that is exposed through the opening of the shield member.

With the configuration (2), the charge amount distribution on the substrate attraction surface can be obtained, so that it is possible to prevent a problem caused by local charging on the substrate attraction surface (e.g., damages inflicted on the substrate during dechucking, or the like).

(3) In the substrate processing apparatus of the configuration (2), the opening may have a sector shape in a plan view.

(4) In the substrate processing apparatus of the configuration (3), a vertex of a central corner of the sector shaped opening may coincide with a rotation center of the mounting table rotated by the rotation driving unit.

With the configuration (4), the charging state of the substrate attraction surface can be detected more accurately.

(5) In the substrate processing apparatus of any one of the configurations (2) to (4), the shield member may be made of a metal and grounded.

With the configuration (5), the charging state of the substrate attraction surface can be accurately detected.

(6) In the substrate processing apparatus of any one of the configurations (1) to (5), the charge neutralization mechanism may perform charge neutralization when the charge amount of the substrate attraction surface of the mounting table exceeds a threshold value.

(7) In the substrate processing apparatus of any one of the configurations (2) to (5), the charge neutralization mechanism may neutralize a portion of the mounting surface of the mounting table where the charge amount exceeds a threshold value.

(8) There is provided a charge neutralization method for a mounting table disposed in a substrate processing apparatus for processing a substrate, the mounting table configured to attract and hold a substrate using an electrostatic attractive force, the method comprising: moving a charge amount measurement unit disposed in a processing chamber to measure charge amount of a substrate attraction surface of the mounting table to a measurement position facing the substrate attraction surface of the mounting table; measuring the charge amount using the charge amount measurement unit; neutralizing the substrate attraction surface of the mounting table according to a measurement result obtained in said measuring; and making the charge amount measurement unit retreat from the measurement position.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing apparatus for processing a substrate, comprising:
a processing chamber accommodating the substrate, a mounting table disposed in the processing chamber and configured to attract and hold the substrate using an electrostatic attractive force;

a charge amount measurement unit disposed in the processing chamber and configured to measure charge amount of a substrate attraction surface of the mounting table in a state where no substrate is mounted on the mounting table;

a charge neutralization mechanism configured to neutralize the substrate attraction surface of the mounting table in a state where no substrate is mounted on the mounting table;

a retreating mechanism configured to make the charge amount measurement unit retreat from a measurement position facing the substrate attraction surface of the mounting table, the retreating mechanism including a supporting shaft and a driving unit; and a shield member disposable between the charge amount measurement unit located at the measurement position and the mounting table and provided with an opening smaller than the substrate attraction surface of the mounting table, wherein the supporting shaft extends vertically along a side of the mounting table, with a supporting portion and a connecting portion being connected to the supporting shaft in an order from top to bottom, the charge amount measurement unit is disposed below one end of the supporting portion extending in a direction orthogonal to the supporting shaft, and the shield member is connected to the connecting portion extending in a direction orthogonal to the supporting shaft.

2. The substrate processing apparatus of claim 1, further comprising:

a rotation driving unit configured to rotate the mounting table, wherein the rotation driving unit rotates the mounting table so that a portion of the substrate attraction surface of the mounting table that is exposed through the opening of the shield member to the charge amount measurement unit located at the measurement position is switched, and the charge amount measurement unit sequentially performs the measurement on the portion of the substrate attraction surface of the mounting table that is exposed through the opening of the shield member.

3. The substrate processing apparatus of claim 2, wherein the opening has a sector shape in a plan view.

4. The substrate processing apparatus of claim 3, wherein a vertex of a central corner of the sector shaped opening coincides with a rotation center of the mounting table rotated by the rotation driving unit.

5. The substrate processing apparatus of claim 2, wherein the charge neutralization mechanism neutralizes a portion of the mounting surface of the mounting table where the charge amount exceeds a threshold value.

6. The substrate processing apparatus of claim 1, wherein the shield member is made of a metal and grounded.

7. The substrate processing apparatus of claim 1, wherein the charge neutralization mechanism performs charge neutralization when the charge amount of the substrate attraction surface of the mounting table exceeds a threshold value.

* * * * *